(12) United States Patent
Aki et al.

(10) Patent No.: US 10,365,310 B2
(45) Date of Patent: Jul. 30, 2019

(54) IMPEDANCE ESTIMATION DEVICE AND ESTIMATION METHOD FOR POWER DISTRIBUTION LINE

(71) Applicant: NATIONAL INSTITUTE OF ADVANCED INDUSTRIAL SCIENCE AND TECHNOLOGY, Tokyo (JP)

(72) Inventors: Hirohisa Aki, Ibaraki (JP); Yasuo Hasegawa, Ibaraki (JP); Sekyung Han, Ibaraki (JP); Daisuke Kodaira, Daegu (KR)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 424 days.

(21) Appl. No.: 15/317,477

(22) PCT Filed: Jun. 8, 2015

(86) PCT No.: PCT/JP2015/066479
§ 371 (c)(1),
(2) Date: Dec. 9, 2016

(87) PCT Pub. No.: WO2015/190434
PCT Pub. Date: Dec. 17, 2015

(65) Prior Publication Data
US 2017/0122991 A1 May 4, 2017

(30) Foreign Application Priority Data
Jun. 12, 2014 (JP) ................................ 2014-121480

(51) Int. Cl.
*H02J 3/00* (2006.01)
*G01R 21/00* (2006.01)
(Continued)

(52) U.S. Cl.
CPC .......... *G01R 27/16* (2013.01); *G01R 21/001* (2013.01); *H02J 3/00* (2013.01); *H02J 13/0006* (2013.01); *Y02E 60/74* (2013.01); *Y04S 10/30* (2013.01)

(58) Field of Classification Search
CPC ......... G01R 27/16; G01R 21/001; H02J 3/00; H02J 13/0006; Y02E 60/74; Y04S 10/30
See application file for complete search history.

(56) References Cited

U.S. PATENT DOCUMENTS 7,788,051 B2 * 8/2010 Patel ..................... G06Q 50/06
702/60
8,271,148 B2 * 9/2012 Lee ....................... H02J 3/1828
700/286

(Continued)

FOREIGN PATENT DOCUMENTS

| JP | 2006-087177 A | 3/2006 |
| JP | 2006-230050 A | 8/2006 |
| JP | 2014-017945 A | 1/2014 |

OTHER PUBLICATIONS

International Search Report dated Jul. 28, 2015, for corresponding International Patent Application No. PCT/JP2015/066479. (With English Translation).

(Continued)

*Primary Examiner* — Regis J Betsch
(74) *Attorney, Agent, or Firm* — Pergament & Cepeda LLP; Millagros A. Cepedia; Edward D. Pergament

(57) ABSTRACT

The present application relates to an impedance estimation device and estimation method for a power distribution line, and particularly to an impedance estimation device and estimation method for a power distribution line that estimate the impedance of a power distribution line formed of power (Continued)

distribution wires from a pole transformer to a plurality of consumers and a plurality of lead-in wires.

6 Claims, 4 Drawing Sheets

(51) Int. Cl.
  *G01R 27/16* (2006.01)
  *H02J 13/00* (2006.01)

(56) References Cited

U.S. PATENT DOCUMENTS

| | | | |
|---|---|---|---|
| 2002/0097055 A1 | 7/2002 | Pinzon et al. | |
| 2002/0123849 A1 | 9/2002 | Quaintance et al. | |
| 2012/0059609 A1* | 3/2012 | Oh | G01R 22/066 702/62 |
| 2012/0280673 A1* | 11/2012 | Watanabe | H02J 3/1885 323/304 |
| 2014/0200729 A1* | 7/2014 | Yamane | H02J 13/0006 700/295 |

OTHER PUBLICATIONS

Written Opinion dated Jul. 28, 2015, for corresponding International Patent Application No. PCT/JP2015/066479. (With English Translation).
International Preliminary Report on Patentability dated Dec. 15, 2016, for corresponding International Patent Application No. PCT/JP2015/066479.

\* cited by examiner

IMPEDANCE ESTIMATION DEVICE AND ESTIMATION METHOD FOR POWER DISTRIBUTION LINE

This application is a National Phase application under 35 U.S.C. 371 of International Application No. PCT/JP2015/066479, filed on Jun. 8, 2015, which claims priority to Japanese provisional application No. 2014-121480, filed on Jun. 12, 2014, all of which are hereby incorporated by references in their entireties.

TECHNICAL FIELD

The present invention relates to an impedance estimation device and estimation method for a power distribution line, and particularly to an impedance estimation device and estimation method for a power distribution line that estimate the impedance of a power distribution line formed of power distribution wires from a pole transformer to a plurality of consumers and a plurality of lead-in wires.

BACKGROUND ART

In recent years, the number of consumers who use private power generation facilities (distributed power supply), such as a solar cell, a fuel cell, and a wind-power-based generator, in coordination with an existing power distribution system is increasing. In such a coordinated power system, the voltage of the distributed power supply varies, for example, because the active power of the distributed power supply flows into the input of the existing power distribution system and the active power described above itself varies. To maintain the coordination point voltage within a specified voltage range, it is necessary to determine an optimum value of the reactive power of the distributed power supply for minimizing the variation in the voltage of the distributed power supply. To this end, it is necessary to determine the power system impedance of the existing power distribution system.

As a technology of related art for determining the power system impedance, for example, the power system impedance estimation device described in Japanese Patent Application Laid-Open (JP-A) No. 2006-230050 is known. The power system impedance estimation device, in coordination with the existing power system that supplies a load with power, outputs active power $P_G$ and reactive power $Q_G$ to the coordination point, detects a voltage effective value V (voltage at the coordination point), the active power $P_G$, and the reactive power $Q_G$ at the coordination point in the case where the active power $P_G$ and the reactive power $Q_G$ are intentionally varied, and solves simultaneous equations set up by relating expressions formed of voltage variation $\Delta V$ at the coordination point, load power (P+jQ) consumed by the load connected to the coordination point, and power system impedance (R+jX) of the existing power system to one another in terms of a plurality of points of time to determine an estimated value of the power system impedance (R+jX).

CITATION LIST

Patent Literature

PTL 1: Japanese Patent Application Laid-Open (JP-A) No. 2006-230050

SUMMARY OF INVENTION

Technical Problem

The power system impedance estimation device described in PTL 1 Japanese Patent Application Laid-Open (JP-A) No. 2006-230050, however, always needs to be installed at the coordination point described above present within the range of power system impedance to be measured (hereinafter simply referred to as "system impedance"). Therefore, to measure the system impedance in each of a large number of narrow segments, the system impedance estimation device needs to be installed at each of the coordination points at the boundaries between the segments. However, since it is substantially difficult to install the system impedance estimation device described above in the site of a consumer, it is difficult to measure detailed system impedance to the consumer. Further, it is difficult to conceive of an effective use of the system impedance estimation device described in Japanese Patent Application Laid-Open (JP-A) No. 2006-230050 other than the use in measurement of the system impedance. From these reasons, it is difficult in practice for the system impedance estimation device described in Japanese Patent Application Laid-Open (JP-A) No. 2006-230050 to measure the system impedance not only over a wide range but also in narrow divided segments therebetween, that is, detailed system impedance to a consumer.

The present invention has been made in view of the points described above, and an object of the present invention is to provide an impedance estimation device and estimation method for a power distribution line capable of determining an estimated value of the impedance of an overall inter-consumer power distribution line including not only a power distribution wire of the power distribution system but also a lead-in wire not only over a wide range but also in narrow divided segments therebetween.

Another object of the present invention is to provide an impedance estimation device and estimation method for a power distribution line capable of determining the impedance of a wide-range power distribution line along which a large number of coordination points are present by forming a power distribution network including consumers within the wide range and sharing basic data measured at a location close to a power distribution panel of each of the consumers to specifically determine an estimated value of the impedance of a wide-range, inter-consumer power distribution line.

Solution to Problem

<1> An impedance estimation device for a power distribution line provided in each of a plurality of consumers individually connected to respective lead-in wires that branch off from a plurality of junctions on power distribution wires connected to a transformer, the impedance estimation devices forming a single power distribution network for mutual communication, the impedance estimation device for the power distribution line including: a measurement unit configured to measure not only active power and reactive power of at least one of AC power supplied via the power distribution wire and the lead-in wire and consumed by the consumer and power generated by a generator connected to the consumer but also an effective value of at least one of current flowing into the consumer via the lead-in wire and current flowing into the consumer from the generator and an effective value of voltage, in synchronization with each other; an information sharing unit configured to share the active power, the reactive power, the effective value of the current, and the effective value of the voltage measured by the measurement unit in each of the consumers among the plurality of consumers over mutual communication using the single power distribution network; and a computation unit configured to set up and solve a plurality of nonlinear simultaneous equations having the following corresponding to a plurality of different points of time as solutions: terminal impedance that is impedance of the power distribution wire from the junction on the lead-in wire to the consumer among the plurality of consumers that is adjacent to a terminal consumer in a position farthest from the transformer and is a second consumer counted from the terminal consumer, to the terminal consumer; lead-in wire impedance of the lead-in wire connected to each of the consumers; and inter-junction impedance between respective adjacent junctions, based on the active power, the reactive power, the effective value of the current, and the effective value of the voltage respectively measured by the measurement unit at the different points of time to derive estimated values of the terminal impedance, the lead-in wire impedance, and the inter-junction impedance.

<2> The impedance estimation device for a power distribution line according to <1>, wherein the computation unit is configured to set up a plurality of nonlinear simultaneous equations corresponding to a plurality of different points of time and having the terminal impedance and the lead-in wire impedance of the lead-in wire connected to the second consumer counted from the terminal consumer as unknowns based on the active power, the reactive power, the effective value of the current, and the effective value of the voltage respectively measured at the plurality of different points of time by the measurement unit in two of the consumers, which are the terminal consumer and the consumer that is adjacent to the terminal consumer and is the second consumer counted from the terminal consumer, and derive solutions of the nonlinear simultaneous equations as estimated values of the terminal impedance and the lead-in wire impedance, then set, among the plurality of consumers, a third consumer counted from the terminal consumer to a consumer closest to the transformer to be targets of the computation performed sequentially in a direction from the third consumer toward the consumer closest to the transformer, and when the third consumer counted from the terminal consumer is a target of the computation, based on the active power, the reactive power, the effective value of the current, and the effective value of the voltage respectively measured by the measurement unit in the third consumer counted from the terminal consumer at a plurality of different points of time and estimated values of the terminal impedance and the lead-in wire impedance derived before, set up a plurality of nonlinear simultaneous equations corresponding to the plurality of points of time and having the lead-in wire impedance of the lead-in wire connected to the third consumer counted from the terminal consumer and the inter-junction impedance from the junction on the lead-in wire connected to the third consumer counted from the terminal consumer to the junction adjacent to the junction on the lead-in wire on a side closer to the terminal consumer as unknowns and perform computation for deriving solutions of the nonlinear simultaneous equations as estimated values of the unknown lead-in wire impedance and inter-junction impedance.

<3> The impedance estimation device for a power distribution line according to <2>, wherein when a fourth consumer counted from the terminal consumer to the consumer closest to the transformer are targets of the computation, based on the active power, the reactive power, the effective value of the current, and the effective value of the voltage respectively measured by the measurement unit in the consumers that are the targets of the computation at a plurality of different points of time and estimated values of the lead-in wire impedance and the inter-junction impedance derived by preceding computation, the computation unit is configured to set up a plurality of nonlinear simultaneous equations corresponding to the plurality of points of time and having the lead-in wire impedance of the lead-in wires connected to the consumers that are the targets of the computation and the inter-junction impedance from the junctions on the lead-in wires connected to the consumers that are the targets of the computation to the junctions adjacent to the junctions on the lead-in wires on a side closer to the terminal consumer as unknowns and repeatedly perform computation for deriving solutions of the nonlinear simultaneous equations as estimated values of the unknown lead-in wire impedance and inter-junction impedance on the fourth consumer counted from the terminal consumer to the consumer closest to the transformer sequentially from the fourth consumer counted from the terminal consumer to the consumer closest to the transformer.

<4> The impedance estimation device for a power distribution line according to <1> or <2>, wherein the computation performed by the computation unit is performed by the impedance estimation device provided in an arbitrary consumer specified in advance among the plurality of consumers.

<5> The impedance estimation device for a power distribution line according to any one of <1> to <4>, wherein the mutual communication over the single power distribution network is power line communication using the power distribution wires and the lead-in wires.

<6> An impedance estimation method using an impedance estimation device for a power distribution line provided in each of a plurality of consumers individually connected to respective lead-in wires that branch off from a plurality of junctions on power distribution wires connected to a transformer, the impedance estimation devices forming a single power distribution network for mutual communication, the impedance estimation method for the power distribution line including: a measurement step of measuring not only active power and reactive power of at least one of AC power supplied via the power distribution wire and the lead-in wire and consumed by the consumer and power generated by a generator connected to the consumer but also an effective value of at least one of current flowing into the consumer via the lead-in wire and current flowing into the consumer from the generator and an effective value of voltage, in synchronization with each other; information sharing step of sharing the active power, the reactive power, the effective value of the current, and the effective value of the voltage measured in the measurement step in each of the consumers among the plurality of consumers over mutual communication using the single power distribution network; and computation step of setting up and solving a plurality of nonlinear simultaneous equations having the following corresponding to a plurality of different points of time as solutions: terminal impedance that is impedance of the power distribution wire from the junction on the lead-in wire to the consumer among the plurality of consumers that is adjacent to a terminal consumer in a position farthest from the transformer and is a second consumer counted from the terminal consumer, to the terminal consumer; lead-in wire impedance of the lead-in wire connected to each of the consumers; and inter-junction impedance between respective adjacent junctions, based on the active power, the reactive power, the effective value of the current, and the effective value of the voltage respectively measured by the measurement unit at the different points of time to derive estimated values of the terminal impedance, the lead-in wire impedance, and the inter-junction impedance.

Advantageous Effects of Invention

The present invention can provide an impedance estimation device and estimation method for a power distribution line capable of determining an estimated value of the impedance of an overall inter-consumer power distribution line including not only a power distribution wire of the power distribution system but also a lead-in wire not only over a wide range but also in narrow divided segments therebetween.

The present invention can further provide an impedance estimation device and estimation method for a power distribution line capable of determining the impedance of a wide-range power distribution line along which a large number of coordination points are present by forming a power distribution network including consumers within the wide range and sharing basic data measured at a location close to a power distribution panel in each of the consumers to specifically determine an estimated value of the impedance of a wide-range, inter-consumer power distribution line.

DESCRIPTION OF EMBODIMENTS

An impedance estimation device and estimation method for a power distribution line of the present invention are intended to cooperatively control generators and variable loads introduced in a large number of consumers in such a way that control of the voltage and frequency of the generators, leveling of the load, and other types of control are performed on a system formed of a plurality of consumers within a fixed range instead of each of the consumers to allow the individual consumers to contribute to a power distribution system in the fixed range. The impedance estimation device and estimation method for a power distribution line of the present invention are intended to be introduced by the individual consumers' investment. The individual consumers use the impedance estimation device and estimation method for a power distribution line of the present invention to cooperatively control the generators and variable loads and receive compensation corresponding to the contribution to operation of the power distribution system, whereby it is conceivable that the individual consumers can recover introduction cost of the impedance estimation device and estimation method for a power distribution line of the present invention.

An embodiment of the impedance estimation device and estimation method for a power distribution line according to the present invention will next be described in detail with reference to the drawings.

Figure 1:
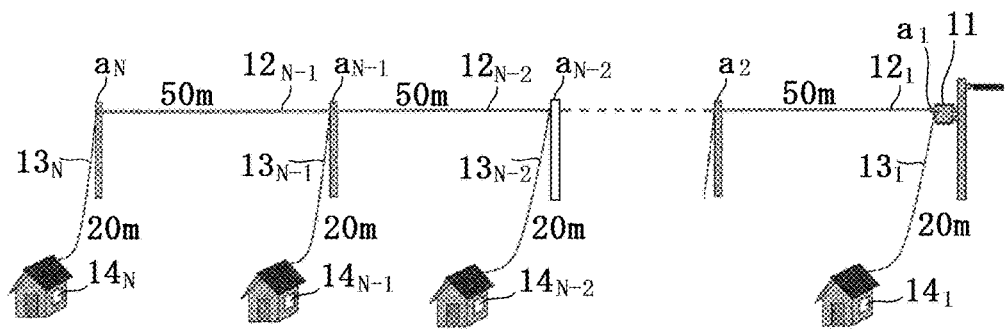
FIG. 1 is a power distribution system diagram of an embodiment of an impedance estimation device for a power distribution line according to the present invention.

FIG. 1 shows a power distribution system diagram of an embodiment of the impedance estimation device for a power distribution line according to the present invention. In FIG. 1, power distribution wires $12_1$ to $12_{N-1}$, which extend from a pole transformer 11, are connected to a consumer $14_1$ via a lead-in wire $13_1$, which branches off by the pole transformer 11 and has a length, for example, of 20 m, and branch off from respective N junctions $a_1$ to $a_N$, which are provided, for example, every 50 m, into lead-in wires $13_1$ to $13_N$ and are connected to consumers $14_1$ to $14_N$. N is an arbitrary integer greater than or equal to 2.

An impedance estimation device is installed in each of the consumers $14_1$ to $14_N$. The impedance estimation device may be provided as an independent apparatus or can instead be implemented as a function module of a controller of a system coordination device (such as energy storage device, plug-in electric car, and solar power generation/power conditioning system). Such an apparatus or module is referred to as the impedance estimation device in the present specification irrespective of the form of the apparatus or module. Each of the consumers, when described in relation to the impedance estimation device, represents a power facility installed in the consumer.

The impedance estimation devices respectively measure active power $P_1$ to $P_N$ and reactive power $Q_1$ to $Q_N$ consumed by the consumers $14_1$ to $14_N$ where the impedance estimation devices are installed, or generated by generators connected to the consumers $14_1$ to $14_N$, effective values $I_1$ to $I_N$ of the current flowing into the consumers, and effective values $V_1$ to $V_N$ of the voltage at the consumers at a plurality of different points of time. In the present embodiment, the four pieces of measured information ($P_1$ to $P_N$, $Q_1$ to $Q_N$, $I_1$ to $I_N$, and $V_1$ to $V_N$) measured with the impedance estimation devices in the consumers are shared over power line communication, nonlinear simultaneous equations having the impedance of each of the segments between adjacent junctions and the impedance of each of the lead-in wires as unknowns (solutions) are set up at every measurement points of time by using the shared four pieces of measured information, and estimated values of the impedance of the power distribution lines formed of the power distribution wires and the lead-in wires between the consumers by solving the nonlinear simultaneous equations, as will be described later.

The computation of the estimated value described above performed by the impedance estimation device for a power distribution line of the present embodiment can be performed by an impedance estimation device arbitrarily specified in advance among the impedance estimation devices in the consumers $14_1$ to $14_N$. To allow the impedance estimation device to measure the four pieces of measured information ($P_1$ to $P_N$, $Q_1$ to $Q_N$, $I_1$ to $I_N$, and $V_1$ to $V_N$) described above, a simple measurement device, such as a power meter originally present in a consumer, can be used, and no mechanism that independently generates power, such as the mechanism described in Japanese Patent Application Laid-Open (JP-A) No. 2006-230050, is required. It is, however, noted that the measurement device needs to have a communication function, as will be described later.

Functions of the impedance estimation device will next be described in more detail.

The impedance estimation device has (1) a power line communication (PLC) function, (2) a synchronized basic data measurement function, and (3) a line impedance estimation function.

The PLC communication function (1) is a communication function using a power line as a transmission path, and the "power line" used herein refers to a lead-in wire and a power distribution wire. The PLC communication function allows information exchange via mutual data communication only among impedance estimation devices that form the same power distribution network. That is, in the PLC communication, the magnitude of a transmitted signal is by nature greatly attenuated when the signal passes through a transformer. In broadband PLC using a 30-MHz band or a higher-frequency band, in particular, it is almost impossible to transmit a signal with the magnitude thereof being greater than the magnitude before passage through a transformer. The PLC communication function therefore allows the impedance estimation devices in the consumers $14_1$ to $14_N$ connected to the lead-in wires $13_1$ to $13_N$, which branch off from the power distribution wires $12_1$ to $12_{N-1}$ extending from the same pole transformer 11, to form the same power distribution network so that the data communication range can be limited only to the range including the impedance estimation devices in the power distribution network. Since the communication range can be limited to the same power distribution network, there is no concern about leakage of information on the consumers to the upstream side beyond the pole transformer 11.

The synchronized basic data measurement function (2) is the function of measuring effective values of the voltage across and the current flowing through the lead-in wires $13_1$ to $13_N$, which enter the power distribution panels of the consumers $14_1$ to $14_N$, and the amount of power flowing through the lead-in wires $13_1$ to $13_N$ in such a way that the measured amount of power is separated into the amount of active power and the amount of reactive power. The four pieces of measured measurement information (voltage effective value, current effective value, amount of active power, and amount of reactive power) are referred to as "basic data" in the present specification.

Each of the impedance estimation devices does not measure the basic data at an arbitrary point of time but measures the basic data in in-seconds synchronization with the other impedance estimation devices in the same power distribution network, and the impedance estimation devices share the measured basic data. To this end, the PLC communication function described above is used. The communication protocol for sharing the basic data is not limited to a specific one and may be any communication protocol that allows a synchronization error in the measurement of the basic data to fall within several seconds.

The line impedance estimation function (3) is the function of collecting and analyzing the synchronously measured basic data shared by the impedance estimation devices in the same power distribution network on the basis of the synchronized basic data measurement function (2) to determine estimated values of the line impedance between the consumers. At least one impedance estimation device arbitrarily specified in advance among the impedance estimation devices in the consumers $14_1$ to $14_N$ has the line impedance estimation function.

A method for determining estimated values of the line impedance will next be described in more detail.

Figure 2:
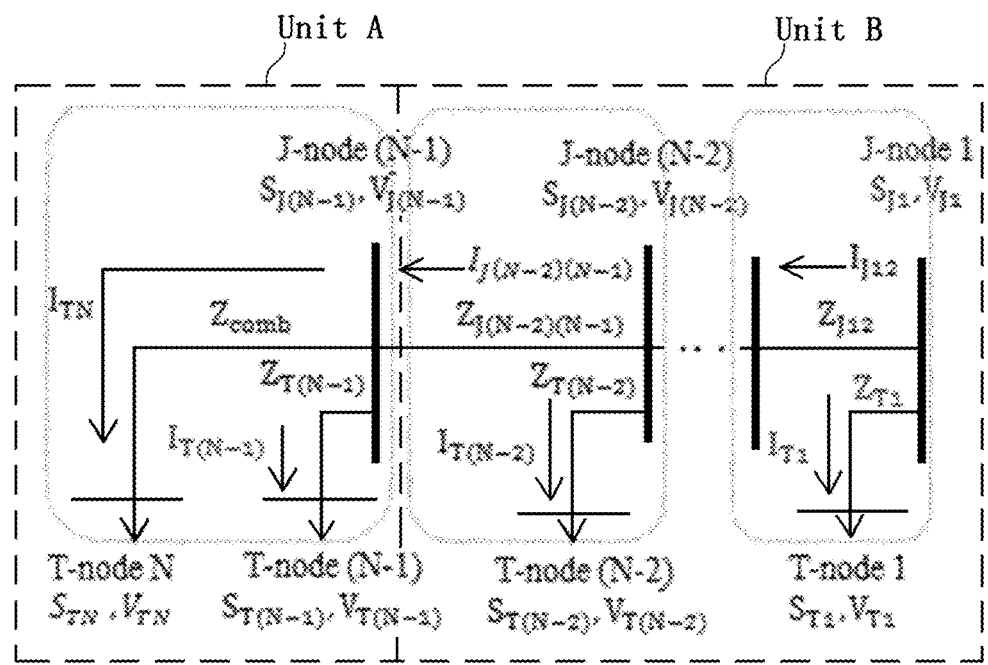
FIG. 2 is a modeled version of the power distribution system diagram shown in FIG. 1 for determination of an estimated value of line impedance.

FIG. 2 shows a modeled version of the power distribution system diagram shown in FIG. 1 for determination of estimated values of the line impedance. In FIG. 2, T-node N is a consumer corresponding to the terminal consumer $14_N$ among the N consumers $14_1$ to $14_N$ connected to the power distribution wires $12_1$ to $12_{N-1}$, which extend from the pole transformer 11, via the lead-in wires $13_1$ to $13_N$ in the power distribution system diagram shown in FIG. 1, and T-node (N-1) is a consumer corresponding to the consumer $14_{N-1}$ in FIG. 1, which branches off immediately before the terminal consumer $14_N$. Similarly, in the following description, the consumers are referred to as T-node (N-2), T-node (N-3), . . . , in the direction closer to the pole transformer 11, and the consumer $14_1$ closest to the pole transformer 11 is referred to as T-node 1. Further, a junction where a lead-in wire branches off from a power distribution wire is called J-node and is given the same number of the branched T-node. For example, the junction where the lead-in wire to the (N-2)-th consumer T-node (N-2) branches off is referred to as J-node (N-2). In the same manner, the junction where the lead-in wire to the (N-1)-th consumer T-node (N-1) branches off is referred to as J-node (N-1), but it is noted that J-node (N-1) branches off into two nodes, T-node N and T-node (N-1), as an exception.

In the model shown in FIG. 2, an area containing two consumers formed of the terminal consumer T-node N and the consumer T-node (N-1), which branches off immediately before T-node N, in the power distribution system is referred to as a unit A (Unit A), and an area containing the remaining consumers T-node (N-2) to T-node 1 in the power distribution system that are connected to the pole transformer is referred to as a unit B (Unit B). Only one Unit A is therefore always present on the downstream power distribution wire connected to the pole transformer. The reason why the model is divided into Unit A and Unit B is that an impedance estimation computation method performed by each of the impedance estimation devices of the present embodiment in one of the two areas differs from the method in the other, and the impedance estimation computation is always first performed in Unit A and then performed in Unit B for ease of calculation, as will be described later.

A variety of symbols in the model shown in FIG. 2 will now be described. $S_T$ or complex power $S_J$ consumed by each consumer T-node represents the sum of complex power consumed or generated by each consumer shifted from the corresponding junction J-node toward the terminal side and complex power loss that occurs in the power distribution wire and the lead-in wire. The complex power is expressed by power (P+jQ), which is the sum of active power P and reactive power Q, as is already known.

$V_T$ represents complex voltage at a consumer T-node, and $V_J$ represents complex voltage at a junction J-node. Since it is difficult for a simple device, such as a typical power meter, to measure the complex voltages each containing a phase angle, the complex voltages cannot be directly measured with an apparatus. Therefore, the fact that $|V_T|$ and $|V_J|$, which are absolute values of the complex voltages $V_T$ and $V_J$ described above, are equal to the effective values thereof is used to measure only $|V_T|$ and $|V_J|$ with a simple device, such as a power meter installed in each consumer or the impedance estimation device of the present embodiment. $I_T$ and $I_J$ represent complex current at a consumer T-node and a junction J-node, respectively, and the direction in which the current flows from the pole transformer toward the terminal is assumed to be the positive direction. Since these complex currents cannot be measured with a simple device, such as a typical power meter, as in the case of the complex voltage, the fact that $|I_T|$ and $|I_J|$, which are absolute values of the complex currents $I_T$ and $I_J$ described above, are equal to the effective values thereof is used to measure only $|I_T|$ and $|I_J|$ with the impedance estimation device of the present embodiment. The symbols described above are suffixed with the number of a consumer to identify a consumer to which the information belongs. For example, the complex power at the N-th consumer T-node N is called $S_{TN}$, and the complex voltage at the (N−1)-th junction J-node (N−1) is called $V_{J(N-1)}$.

$Z_T$ expressed by a complex number is lead-in wire impedance of the lead-in wire from a junction J-node to a consumer T-node, and the number of the consumer T-node is suffixed to the symbol $Z_T$. $Z_J$ is the inter-junction impedance between different junctions J-node, and the numbers of the J-nodes before and after the junction in question are continuously suffixed to the symbol $Z_J$. For example, the lead-in wire impedance of the lead-in wire from the junction J-node (N−1) to the consumer T-node (N−1) is expressed by $Z_{T(N-1)}$, and the impedance of the power distribution wire between the junction J-node (N−2) and the junction J-node (N−1) is expressed by $Z_{J(N-2)(N-1)}$. It is, however, noted that the impedance of the last power distribution wire is exceptionally expressed as Zcomb, which is the combination of the impedance of the lead-in wire from the junction J-node (N−1) to the consumer T-node N and the impedance of the power distribution line and is also called terminal impedance.

Figure 3:
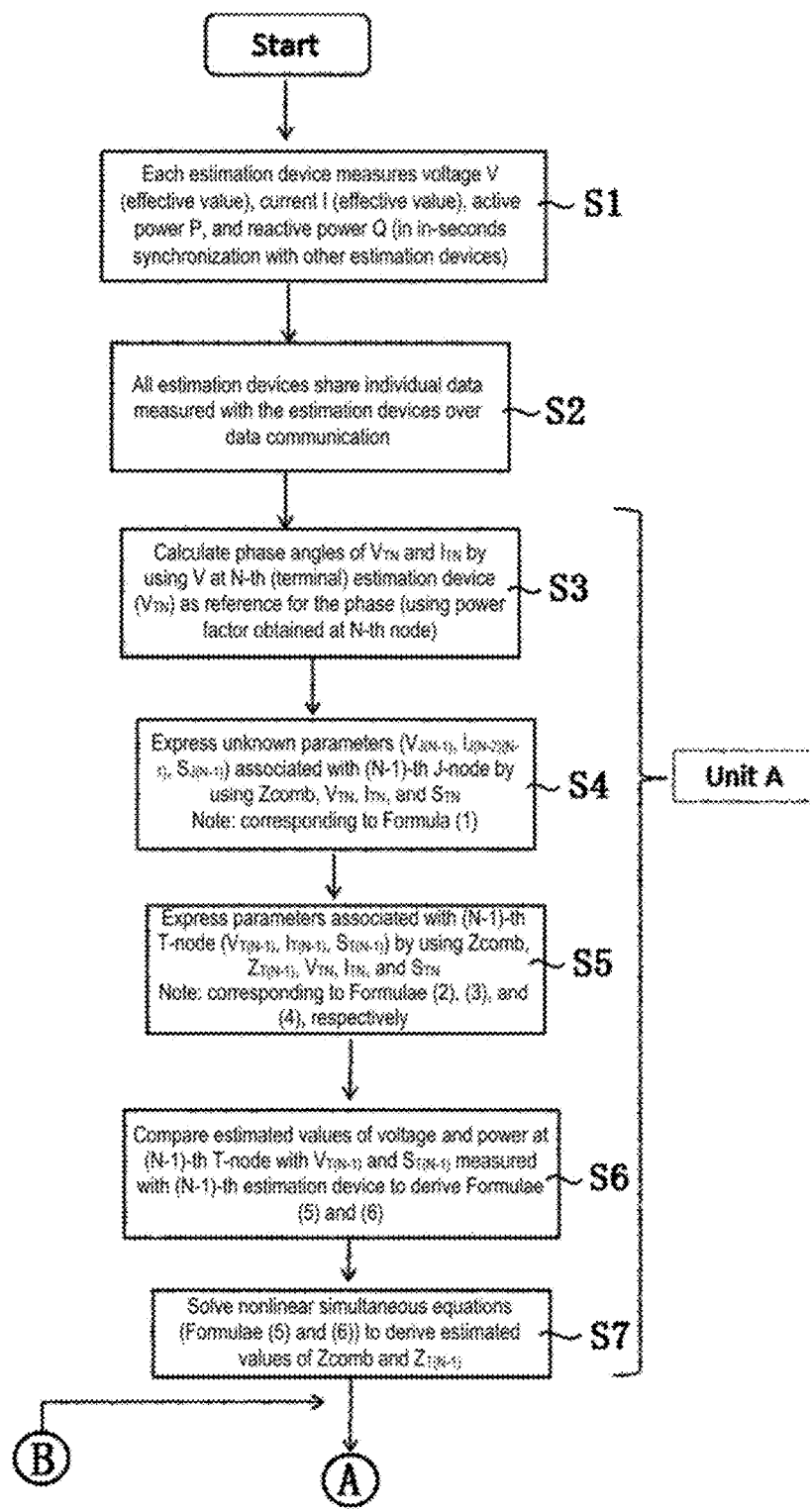
FIG. 3 is a flowchart (No. 1) for describing a specific method for computing the estimated value of the line impedance according to the present invention.
Figure 4:
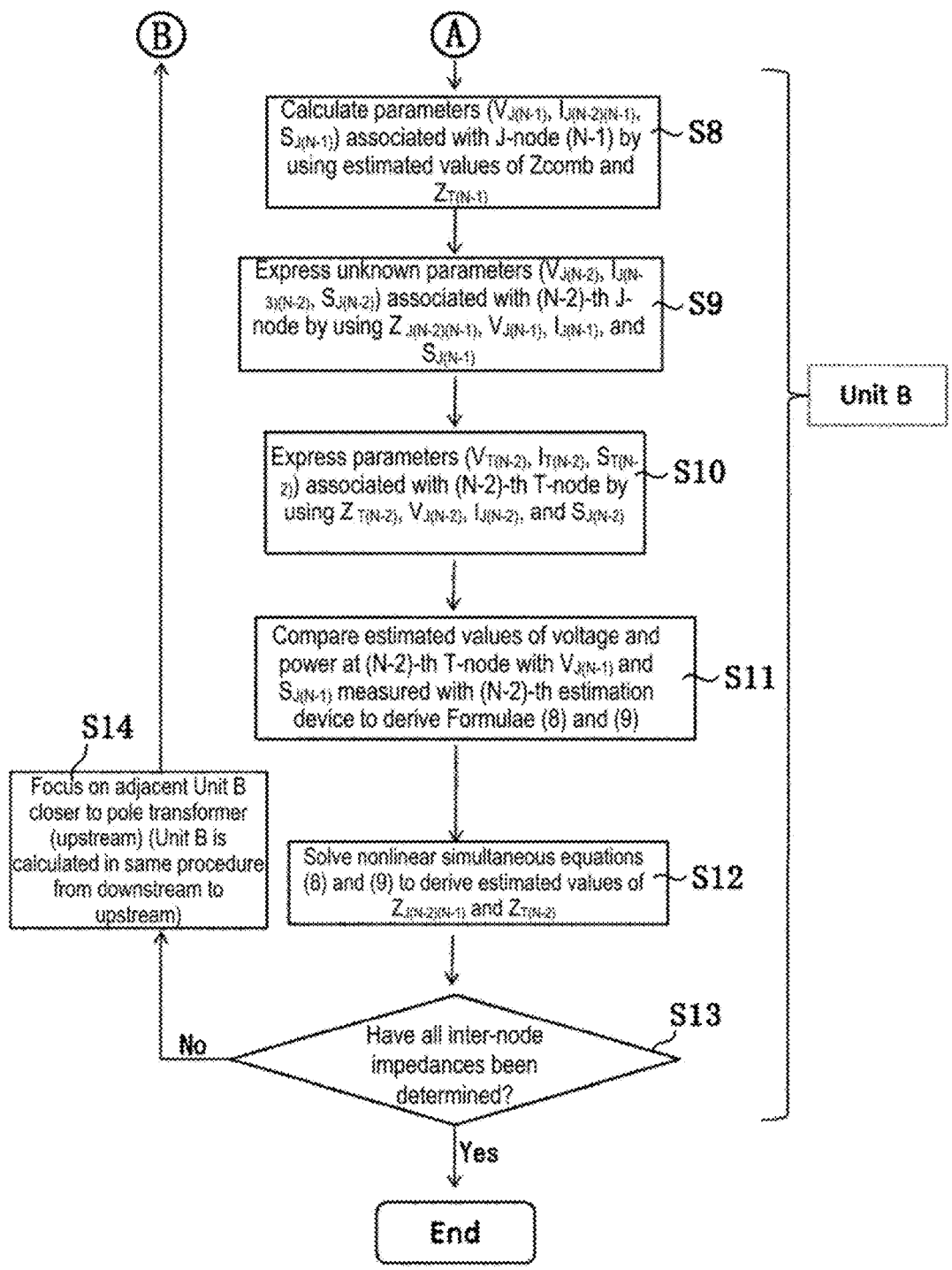
FIG. 4 is a flowchart (No. 2) for describing a specific method for computing the estimated value of the line impedance according to the present invention.

A specific method for computing estimated values of the line impedances will next be described in detail with reference to the flowcharts of FIGS. 3 and 4 in conjunction with FIG. 2. In the flowcharts of FIGS. 3 and 4, the impedance estimation device is simply abbreviated to the estimation device.

First, in each of the N consumers T-node N to T-node 1, which are connected to the lead-in wires that branch off from the power distribution wires connected to the pole transformer 11 and form the same power distribution network, the impedance estimation device provided in the consumer measures the basic data in in-seconds synchronization with the other impedance estimation devices by using the PLC communication function described above (see step S1 in FIG. 3).

The basic data is formed of four pieces of data in total, an effective value of the voltage V, an effective value of the current I, the active power P, and the reactive power Q in each consumer. The impedance estimation devices provided in all the consumers T-node N to T-node 1 subsequently use the PLC communication function described above to share the basic data measured with the impedance estimation devices with one another (see step S2 in FIG. 3).

The information transmitted from each of the consumers T-node over the PLC communication propagates to each of the junctions J-node via the lead-in wire, further reaches through each of the junction J-node to the other junctions, and then propagates to the other consumers via the other lead-in wires.

Since the thus measured and shared basic data is formed only of the following four values: an effective value of the voltage V; an effective value of the current I; the active power P; and the reactive power Q, each of the impedance estimation devices cannot directly derive the voltage, current, and other values containing the phase angle at the junction J-node. Each of the impedance estimation devices can, however, use the measured basic data and an estimated impedance value in each of the Units to derive estimated values of the voltage, current, and other values containing the phase angle at the junction J-node. Therefore, an arbitrarily set host impedance estimation device first uses the four pieces of basic data (voltage effective value, current effective value, active power, and reactive power) respectively measured with each of the impedance estimation devices in the two consumers T-node N and T-node (N−1) in Unit A to determine the terminal impedance Zcomb described above and the lead-in wire impedance $Z_{T(N-1)}$ of the lead-in wire from the junction J-node (N−1) to the consumer T-node (N−1).

First, with reference to the phase of the voltage $V_{TN}$ at the terminal (N-th) consumer T-node N, the phase angle of the current $I_{TN}$ measured with the impedance estimation device in the consumer T-node N is calculated (see step S3 in FIG. 3).

The phase angle of the voltage $V_{TN}$ is therefore zero. The phase of the current $I_{TN}$ is calculated on the basis of the power factor calculated from the active power and the reactive power measured with the estimation device in the consumer T-node N.

The unknown parameters ($V_{J(N-1)}$, $I_{J(N-2)(N-1)}$, and complex power $S_{J(N-1)}$) at the (N−1)-th junction J-node (N−1) in FIG. 2 are subsequently expressed by Zcomb, $V_{TN}$, $I_{TN}$, and the complex power $S_{TN}$ (see step S4 in FIG. 3).

It is, however, noted that the complex power S is formed of the sum of the active power and the reactive power and expressed, for example, as $S_{J(N-1)} = P_{J(N-1)} + jQ_{J(N-1)}$. In step S4, for example, the voltage $V_{J(N-1)}$ at the junction J-node (N−1) described above can be expressed by the following formula by using the voltage $V_{TN}$ and the current $I_{TN}$ measured with the impedance estimation device in the terminal (N-th) consumer T-node N and the voltage drop.

$$V_{J(N-1)} = V_{TN} + Z \text{ comb } I_{TN} \quad (1)$$

The phase of the voltage $V_{TN}$ is set as the reference of the phase of all data on each of the consumers. The complex current can be determined by calculating the conjugate complex number of (S/V). The current can therefore be expressed in the form of complex current.

The host impedance estimation device subsequently expresses the parameters of the (N−1)-th consumer T-node (N−1) in FIG. 2 ($|V_{T(B-1)}|$, $|I_{T(N-1)}|$, and $S_{T(N-1)}$ by using Zcomb, $Z_{T(N-1)}$, $V_{TN}$, $I_{TN}$ and $S_{TN}$ (see step S5 in FIG. 3).

In step S5, Formulae (2), (3), and (4) are used. That is, the voltage $V_{J(N-1)}$ at the (N−1)-th junction J-node (N−1) expressed by Formula (1) and the voltage $V_{T(N-1)}$ and the current $I_{T(N-1)}$ in the (N−1)-th consumer T-node (N−1) are related to each other as follows on the basis of the voltage drop due to the lead-in wire impedance $Z_{T(N-1)}$ of the lead-in wire from the junction J-node (N−1) to the consumer T-node (N−1):

$$V_{T(N-1)} = V_{J(N-1)} - Z_{T(N-1)}I_{T(N-1)} = V_{TN} + Z \text{ comb } I_{TN} - Z_{T(N-1)}I_{T(N-1)} \quad (2)$$

Further, the current $I_{T(N-1)}$ in Formula (2), which branches off from the current $I_{J(N-2)(N-1)}$ flowing into the junction J-node (N−1), is expressed by the following formula by using the complex power $S_{TN}$ and $S_{T(N-1)}$ in each of the N-th and (N−1)-th consumers, the terminal impedance Zcomb, and the lead-in wire $Z_{T(N-1)}$.

$$I_{T(N-1)} = I_{J(N-2)(N-1)} - I_{TN} \quad (3)$$
$$= \left( \frac{S_{TN} + Zcomb|I_{TN}|^2 + S_{T(N-1)} + Z_{T(N-1)}|I_{T(N-1)}|^2}{V_{TN} + ZcombI_{TN}} \right)^* -$$
$$I_{TN}$$

In Formula (3), * represents a conjugate complex number.

Further, an estimated value $S_{T(N-1)}$ of the consumed or generated power in the consumer T-node (N−1) is expressed by the following Formula (4):

$$S_{T(N-1)}=(V_{TN}+Z\text{ comb }I_{TN}-Z_{T(N-1)}I_{T(N-1)})(I_{T(N-1)})^* \quad (4)$$

In Formula (4), * represents a conjugate complex number.

On the other hand, the impedance estimation device in the (N−1)-th consumer T-node (N−1) can directly measure the effective value of the voltage $|V_{T(N-1)}|$. The host impedance estimation device therefore compares the measured value with the absolute value of the right side of Formula (2) or the estimation formula described above to define the impedance formula (5) (see step S6 in FIG. 3).

In step S6, the following Formula (5) and Formula (6) are derived.

$$|V_{TN}+Z\text{ comb }I_{TN}-Z_{T(N-1)}I_{T(N-1)}|-|V_{T(N-1)}|=0 \quad (5)$$

In Formula (5), all the values excluding the value of terminal impedance Zcomb of the power distribution wire from the junction J-node (N−1) to the terminal consumer T-node N and the value of the lead-in wire impedance $Z_{T(N-1)}$ of the lead-in wire from the junction J-node (N−1) to the consumer T-node (N−1) are each formed only of the basic data measurable in each consumer. The unknowns in Formula (5) are therefore the terminal impedance Zcomb and the lead-in wire impedance $Z_{T(N-1)}$. Since each of these impedances is expressed by a complex number R+jX (R represents a resistance component, and X represents a reactance component), the number of unknowns in Formula (5) is "4" in total, which is the number of R and X values.

The host impedance estimation device compares an estimated value $S_{T(N-1)}$ of the power consumed or generated in the consumer T-node (N−1) and estimated by the approach of the present invention shown by Formula (4) with the value of the power actually measured with the impedance estimation device of the present embodiment to define Formula (6).

$$(V_{TN}+Z\text{ comb }I_{TN}-Z_{T(N-1)}I_{T(N-1)})(I_{T(N-1)})^*-S_{T(N-1)}=0 \quad (6)$$

In Formula (6), * represents a conjugate complex number. In Formula (6), all the values excluding the values of the terminal impedance Zcomb and the lead-in wire impedance $Z_{T(N-1)}$ are each formed only of the basic data measurable in each consumer, as in Formula (5).

Changing the timeframe of the measurement of the basic data on a consumer and measuring the basic data in at least four patterns allow setup of nonlinear simultaneous equations having the terminal impedance Zcomb and the lead-in wire impedance $Z_{T(N-1)}$ as unknowns, the number of which is "4" or more, from Formulae (5) and (6). The host impedance estimation device can therefore solve the thus set-up four or more nonlinear simultaneous equations having the terminal impedance Zcomb and lead-in wire impedance $Z_{T(N-1)}$ as unknowns to determine an estimated value of each of the terminal impedance Zcomb and the lead-in wire impedance $Z_{T(N-1)}$ (see step S7 in FIG. 3).

As described above, the respective four pieces of the basic data (voltage effective value, current effective value, active power, and reactive power) respectively measured with the impedance estimation device in each of the two consumers T-node N and T-node (N−1) in Unit A are shared by all the impedance estimation devices, and solving the four or more nonlinear simultaneous equations obtained from Formulae (5) and (6) and having the terminal impedance Zcomb and lead-in wire impedance $Z_{T(N-1)}$ as unknowns allows determination of an estimated value of each of the terminal impedance Zcomb and the lead-in wire impedance $Z_{T(N-1)}$.

The impedance estimation devices provided in the consumers in Unit B formed of the remaining consumers excluding the two consumers on the terminal side of the power distribution line then determine estimated values of the remaining impedances (see steps S8 to S14 in FIG. 4). That is, the estimated values of the terminal impedance Zcomb and the lead-in wire impedance $Z_{T(N-1)}$ in Unit A determined in step S7 are first used to calculate specific values of the parameters ($V_{J(N-1)}$, $I_{J(N-2)(N-1)}$, and $S_{J(N-1)}$ associated with the junction J-node (N−1) (step S8).

An estimated value of each of lead-in wire current $13_{N-2}$ flowing into the consumer T-node (N−2) present in Unit B and closest to Unit A and the impedance of inter-junction $12_{N-2}$ (lead-in wire impedance $Z_{T(N-2)}$ and inter-junction impedance $Z_{J(N-2)(N-1)}$) is then determined. These estimated values can be determined by using the same approach as that used to determine estimated values of the impedances in Unit A (see steps S9 to S11 in FIG. 4).

That is, in the consumer T-node (N−2) in Unit B, setting up a formula associated with the current produces Formula (7), as in the case of Formula (3), setting up a formula associated with the voltage produces Formula (8), as in the case of Formula (5), and setting up a formula associated with the power produces Formula (9), as in the case of Formula (6). In Formulae (7) and (9), * represents a conjugate complex number.

$$I_{T(N-2)} = \left( \frac{S_{J(N-1)} + Z_{J(N-2)(N-1)}|I_{J(N-2)(N-1)}|^2 + S_{T(N-2)} + Z_{T(N-2)}|I_{T(N-2)}|^2}{V_{J(N-1)} + Z_{J(N-2)(N-1)}|I_{J(N-2)(N-1)}|} \right)^* - I_{J(N-2)(N-1)} \quad (7)$$

$$|V_{J(N-1)} + Z_{J(N-2)(N-1)}I_{J(N-2)(N-1)} - Z_{T(N-2)}I_{T(N-2)}| - |V_{T(N-2)}| = 0 \quad (8)$$

$$(V_{J(N-1)} + Z_{J(N-2)(N-1)}I_{J(N-2)(N-1)} - Z_{T(N-2)}I_{T(N-2)}) (I_{T(N-2)})^* - S_{T(N-2)} = 0 \quad (9)$$

In Formulae (8) and (9), among the values excluding the inter-junction impedance $Z_{J(N-2)(N-1)}$ between the junction J-node (N−1) and the junction J-node (N−2) and the lead-in wire impedance $Z_{T(N-2)}$ of the lead-in wire from the junction J-node (N−2) to the consumer T-node (N−2), the parameters ($V_{J(N-1)}$, $I_{J(N-2)(N-1)}$, and $S_{J(N-1)}$) at the junction J-node (N−1) have been already determined (step S8), and $|V_{T(N-2)}|$ and $S_{T(N-2)}$ are basic data measurable by using the estimation device in the consumer T-node (N−2). The unknowns in Formulae (8) and (9) are therefore the inter-junction impedance $Z_{J(N-2)(N-1)}$ and the lead-in wire impedance $Z_{T(N-2)}$, and each of these is expressed by a complex number, so that the number of unknowns is "4" in total, which is the number of R and X values. Therefore, changing the timeframe of the measurement of the basic data in the consumer T-node (N−2) and measuring the basic data in at least four patterns allows setup of nonlinear simultaneous equations having the inter-junction impedance $Z_{J(N-2)(N-1)}$ and the lead-in wire impedance $Z_{T(N-2)}$ as unknowns, the number of which is "4" or more, based on Formulae (8) and (9).

Therefore, solving the four or more nonlinear simultaneous equations described above formed of Formulae (8) and (9) and having the impedances $Z_{J(N-2)(N-1)}$ and $Z_{T(N-2)}$ as unknowns allows determination of estimated values of the inter-junction impedance $Z_{(N-2)(N-1)}$ and the lead-in wire impedance $Z_{T(N-2)}$ (see step S12 in FIG. 4).

It is subsequently evaluated whether the impedance between all the junctions in Unit B and the impedances of all the lead-in wires from the junctions to the consumers in Unit B have been determined (see step S13 in FIG. 4).

In a case where all the impedances between adjacent junctions in Unit B and all the lead-in wire impedances of the lead-in wires from the junctions to the consumers in Unit B have not yet determined (No in step S13), a junction closer to the pole transformer and adjacent to the junction at which estimated impedance values have been determined in preceding step S12 is then selected in Unit B (step S14 in FIG. 4), and the control is caused to return to step S8. The computation processes in steps S8 to S14 are thus repeated until estimated values of the lead-in wire impedances of the lead-in wires of the consumers to be computed and the inter-junction impedances between the junctions are determined in Unit B sequentially in the direction from the consumer T-node (N−2) to the consumer T-node 1.

As described above, the impedance estimation device of the present embodiment can determine an estimated value of the system impedance of a power distribution line including a lead-in wire to each consumer, that is, an estimated value of the impedance of a power distribution line formed of power distribution wires and lead-in wires, unlike a system impedance estimation device of related art.

An impedance estimation device for a power distribution line according to the present invention will next be further described.

Figure 5:
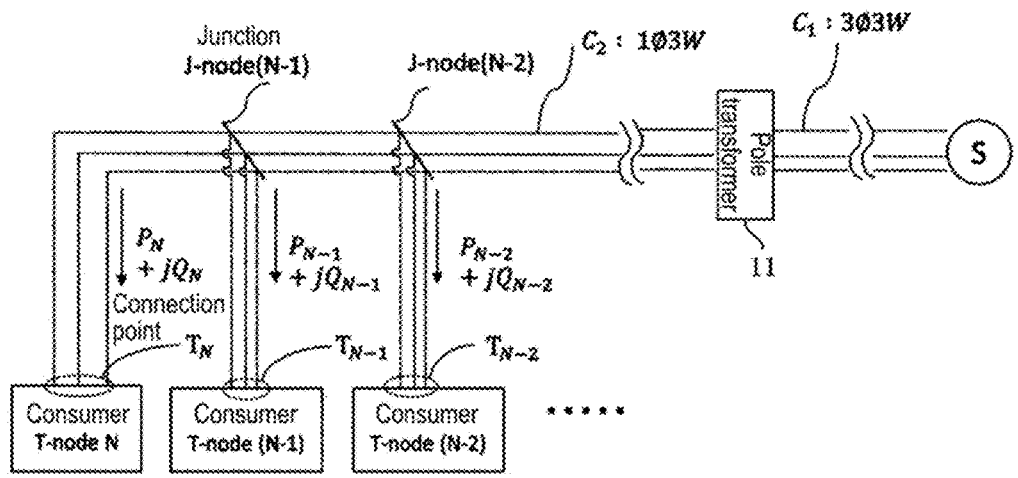
FIG. 5 shows an example of a system for distributing power to a plurality of consumers each including the impedance estimation device for a power distribution line according to the present invention.

FIG. 5 shows an example of a system for distributing power to a plurality of consumers each including the impedance estimation device for a power distribution line according to the present invention. In FIG. 5, the same components as those in FIG. 1 have the same reference characters. FIG. 5 shows substantially the same power distribution system as that shown in FIG. 1. In FIG. 5, a substation for power distribution S is connected to the pole transformer 11 via a three-phase, three-wire power distribution wire $C_1$. Further, the pole transformer 11 is connected to a single-phase, three-wire, low-voltage power distribution wire $C_2$, and the low-voltage power distribution wire $C_2$ is connected to N consumers via lead-in wires. The junction J-node (N−1) represents the junction where the lead-in wire connected to the (N−1)-th consumer T-node (N−1) (corresponding to $14_{N-1}$ in FIG. 1), which is the (N−1)-th counted from the one close to the pole transformer 11, branches off from the low-voltage power distribution wire $C_2$, and J-node (N−2) represents the junction where the lead-in wire connected to the (N−2)-th consumer T-node (N−2) (corresponding to $14_{N-2}$ in FIG. 1) branches off from the low-voltage power distribution wire $C_2$, as described with reference to the model in FIG. 2.

The substation for power distribution S and the power distribution wires $C_1$ and $C_2$ form the existing power system and respectively supply complex power $(P_1+jQ_1)$ to $(P_N+jQ_N)$ formed of active power P and reactive power Q to the N consumers T-node 1 to T-node N (FIG. 5 shows T-node (N−2) to T-node N out of the N consumers). In a case where each of the consumers T-node 1 to T-node N has a distributed power supply, power generated by the distributed power supply is conversely supplied to the existing power system. The impedance estimation devices for a power distribution line of the present embodiment are connected to the existing power system via the lead-in wires at connection points $T_1$ to $T_N$, where the existing power system is connected to the lead-in wires to the consumers T-node 1 to T-node N (FIG. 5 shows $T_{N-2}$ to $T_N$ out of the N connection points), and an estimated value of the impedance, viewed from the connection points, of the existing power system including the lead-in wires, that is, an estimated value of the impedance Z (=R+jX) of the power distribution line is determined, as described with reference to FIG. 2.

Figure 6:
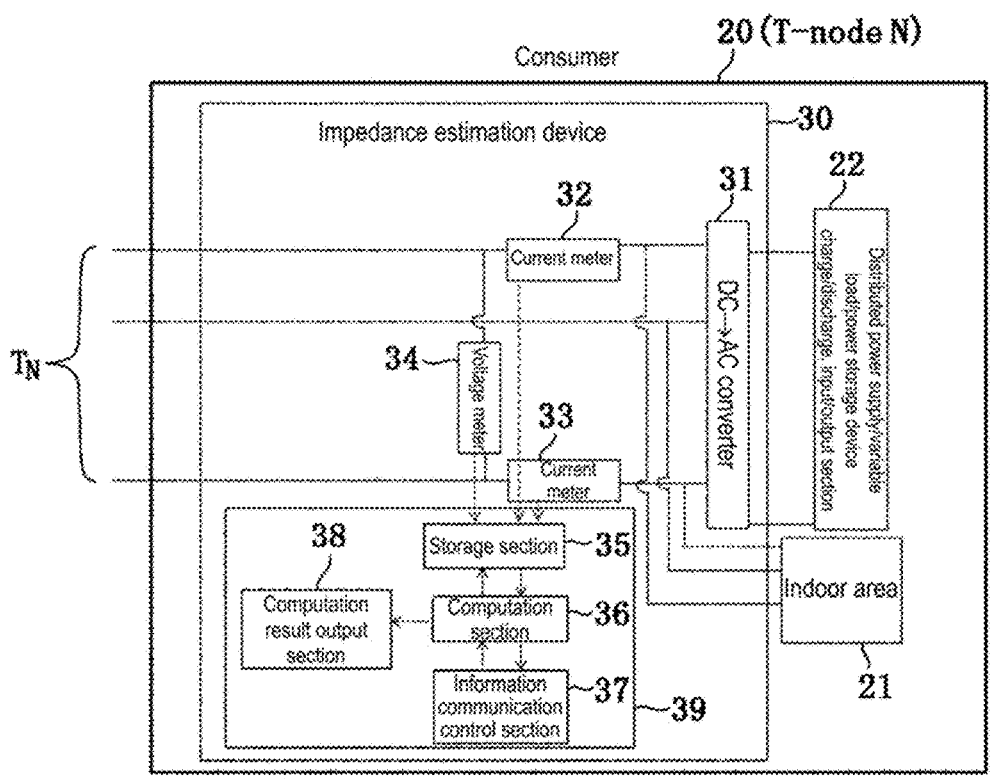
FIG. 6 is a block diagram of an embodiment of the impedance estimation device for a power distribution line according to the present invention.

FIG. 6 is a block diagram of an embodiment of the impedance estimation device for a power distribution line according to the present invention. As described above, the impedance estimation device for a power distribution line of the present embodiment is provided in each of the consumers T-node 1 to T-node N, and the configurations of the impedance estimation devices are the same. In the present embodiment, the description will be made of the configuration and action of the impedance estimation device for a power distribution line in the consumer T-node N (20 in FIG. 6) connected to the connection point $T_N$ in FIG. 5 as a representative impedance estimation device.

In FIG. 6, an impedance estimation device for a power distribution line 30 provided in the consumer 20 is formed of a DC→AC converter 31, which has an input terminal connected to a distributed power supply/variable load/power storage device charge/discharge, input/output section 22 in the consumer 20 and which converts DC current into AC current, current meters 32 and 33 and a voltage meter 34, which are connected to the connection point $T_N$, which is connected to the power distribution wire $C_2$, and a storage section 35, a computation section 36, an information communication control section 37, and a computation result output section 38. The storage section 35, the computation section 36, the information communication control section 37, and the computation result output section 38 form a detected power computation section 39.

The two current meters 32 and 33 respectively measure effective values of the current flowing through two of the three lines excluding the neutral line at the connection point $T_N$, which is connected to the lead-in wire connected via the single-phase, three-line, low-voltage power distribution wire $C_2$, and stores the measured values in the storage section 35 in the detected power computation section 39. Since the current necessary for the calculation is the sum of the currents flowing through the two lines described above, and the currents flowing through the two lines described above are likely to differ from each other, the two current meters 32 and 33 described above are provided. The voltage meter 34 measures an effective value of the voltage at the connection point $T_N$, which is connected to the power distribution wire $C_2$, and stores the measured value in the storage section 35 in the detected power computation section 39. However, in a case where the distributed power supply/variable load/power storage device charge/discharge, input/output section 22 is activated and generates power, the current meters 32 and 33 measure an effective value of the current of an alternating current signal (AC signal) resulting from the conversion of a direct current signal (DC signal) supplied from the distributed power supply/variable load/power storage device charge/discharge, input/output section 22 into the AC signal performed by the DC→AC converter 31, which converts direct current into alternating current, and the voltage meter 34 measures an effective value of the voltage of the AC signal.

The power distribution wire $C_2$ supplies power distribution wires in an indoor area 21 with alternating power via the current meters 32 and 33 and the voltage meter 34. The AC signal from the DC→AC converter 31 is outputted to the connection point $T_N$ via the current meters 32 and 33 and the voltage meter 34 and further outputted to the power distribution wires in the indoor area 21.

The computation section 36 computes power (that is, active power $P_N$ and reactive power $Q_N$) sent and received between a consumer and the power distribution system on the basis of an instantaneous value of the current and an instantaneous value of the voltage produced at the connection point $T_N$ and read from the storage section 35 and stores a result of the computation as detected power in the storage section 35.

Thereafter, the computation section 36 uses detected power (active power $P_N$ and reactive power $Q_N$) at the connection point $T_N$, the connection point current $I_N$, and the connection point voltage $V_N$ read from the storage section 35 and the effective value of the voltage, the effective value of the current, the active power, and the reactive power at the connection point $T_{N-1}$ inputted from the information communication control section 37 to compute an estimated value of the impedance of the power distribution line including the lead-in wire between the connection point $T_N$ and the connection point $T_{N-1}$ by using the method for estimating the impedance of a power distribution line according to the present embodiment described above, stores the obtained estimated value in the storage section 35, and outputs the value by the computation result output section 38 as required.

As described above, the impedance estimation device and estimation method for a power distribution line of the present embodiment allows determination of an estimated value of the impedance of the overall inter-consumer power distribution line including a power distribution wire and a lead-in wire of the power distribution system not only over a wide range of N consumers T-node 1 to T-node N but also in narrow divided segments therebetween.

Further, according to the impedance estimation device and estimation method for a power distribution line of the present embodiment, the impedance of a power distribution line over a wide range within which a large number of junctions (coordination points) are present, specifically, an estimated value of the impedance of an inter-consumer power distribution line over a wide range can be determined by forming a power distribution network including the consumers within the wide range and sharing the basic data measured at the lead-in wires of the power distribution panels in the consumers.

Further, according to the impedance estimation device and estimation method for a power distribution line of the present embodiment, since data necessary for the computation of the estimated value is formed only of an effective value of the voltage, an effective value of the current, the active power, and the reactive power at the connection point that is connected to the lead-in wire in a consumer, a simple measurement apparatus may be used, whereby the introduction cost is advantageously low.

Further, according to the impedance estimation device and estimation method for a power distribution line of the present embodiment, in a case where the state of the system changes (such as an increase and a decrease in the number of consumers connected to the existing power distribution system, introduction and removal of a distributed power supply, and turning on/off of the distributed power supply), the estimated value of the impedance is immediately and automatically determined again, whereby the cooperative control between the consumers can be smoothly performed.

The present invention is not limited to the embodiments described above. For example, instead of installing the impedance estimation device for a power distribution line of the present invention by itself in each consumer as in the embodiment, the impedance estimation device may be installed in conjunction with a distributed power supply and a controllable load in the consumer. In this case, no dedicated apparatus having an impedance estimation function needs to be introduced, whereby the introduction cost to a consumer can be lowered.

REFERENCE SIGNS LIST

11 Pole transformer
$12_1$, $12_{N-2}$, $12_{N-1}$ Power distribution wire
$13_1$ to $13_N$ Lead-in wire
$14_1$ to $14_N$, 20, T-node 1 to T-node N Consumer
21 Indoor area
22 Distributed power supply/variable load/power storage device charge/discharge, input/output section
30 Impedance estimation device
31 DC→AC converter
32, 33 Current meter
34 Voltage meter
35 Storage section
36 Computation section
37 Information communication control section
38 Computation result output section
39 Detected power computation section
$a_1$ to $a_N$, J-node 1, J-node (N−2), J-node (N−1) Junction (coordination point)

The invention claimed is:

1. An impedance estimation device for a power distribution line provided in each of a plurality of consumers individually connected to respective lead-in wires that branch off from a plurality of junctions on power distribution wires connected to a transformer, the impedance estimation devices forming a single power distribution network for mutual communication, the impedance estimation device for the power distribution line comprising:
a measurement unit configured to measure not only active power and reactive power of at least one of AC power supplied via the power distribution wire and the lead-in wire and consumed by the consumer and power generated by a generator connected to the consumer but also an effective value of at least one of current flowing into the consumer via the lead-in wire and current flowing into the consumer from the generator and an effective value of voltage, in synchronization with each other;
an information sharing unit configured to share the active power, the reactive power, the effective value of the current, and the effective value of the voltage measured by the measurement unit in each of the consumers among the plurality of consumers over mutual communication using the single power distribution network; and
a computation unit configured to set up and solve a plurality of nonlinear simultaneous equations having the following corresponding to a plurality of different points of time as solutions: terminal impedance that is impedance of the power distribution wire from the junction on the lead-in wire to the consumer among the plurality of consumers that is adjacent to a terminal consumer in a position farthest from the transformer and is a second consumer counted from the terminal consumer, to the terminal consumer; lead-in wire impedance of the lead-in wire connected to each of the consumers; and inter-junction impedance between respective adjacent junctions, based on the active power, the reactive power, the effective value of the current, and the effective value of the voltage respectively measured by the measurement unit at the different points of time to derive estimated values of the terminal impedance, the lead-in wire impedance, and the inter-junction impedance.

2. The impedance estimation device for a power distribution line according to claim 1,
wherein the computation unit is configured to
set up a plurality of nonlinear simultaneous equations corresponding to a plurality of different points of time and having the terminal impedance and the lead-in wire impedance of the lead-in wire connected to the second consumer counted from the terminal consumer as unknowns based on the active power, the reactive power, the effective value of the current, and the effective value of the voltage respectively measured at the plurality of different points of time by the measurement unit in two of the consumers, which are the terminal consumer and the consumer that is adjacent to the terminal consumer and is the second consumer counted from the terminal consumer, and derive solutions of the nonlinear simultaneous equations as estimated values of the terminal impedance and the lead-in wire impedance,
then set, among the plurality of consumers, a third consumer counted from the terminal consumer to a consumer closest to the transformer to be targets of the computation performed sequentially in a direction from the third consumer toward the consumer closest to the transformer, and
when the third consumer counted from the terminal consumer is a target of the computation, based on the active power, the reactive power, the effective value of the current, and the effective value of the voltage respectively measured by the measurement unit in the third consumer counted from the terminal consumer at a plurality of different points of time and estimated values of the terminal impedance and the lead-in wire impedance derived before,
set up a plurality of nonlinear simultaneous equations corresponding to the plurality of points of time and having the lead-in wire impedance of the lead-in wire connected to the third consumer counted from the terminal consumer and the inter-junction impedance from the junction on the lead-in wire connected to the third consumer counted from the terminal consumer to the junction adjacent to the junction on the lead-in wire on a side closer to the terminal consumer as unknowns and perform computation for deriving solutions of the nonlinear simultaneous equations as estimated values of the unknown lead-in wire impedance and inter-junction impedance.

3. The impedance estimation device for a power distribution line according to claim 2,
wherein when a fourth consumer counted from the terminal consumer to the consumer closest to the transformer are targets of the computation, based on the active power, the reactive power, the effective value of the current, and the effective value of the voltage respectively measured by the measurement unit in the consumers that are the targets of the computation at a plurality of different points of time and estimated values of the lead-in wire impedance and the inter-junction impedance derived by preceding computation,
the computation unit is configured to set up a plurality of nonlinear simultaneous equations corresponding to the plurality of points of time and having the lead-in wire impedance of the lead-in wires connected to the consumers that are the targets of the computation and the inter-junction impedance from the junctions on the lead-in wires connected to the consumers that are the targets of the computation to the junctions adjacent to the junctions on the lead-in wires on a side closer to the terminal consumer as unknowns and repeatedly perform computation for deriving solutions of the nonlinear simultaneous equations as estimated values of the unknown lead-in wire impedance and inter-junction impedance on the fourth consumer counted from the terminal consumer to the consumer closest to the transformer sequentially from the fourth consumer counted from the terminal consumer to the consumer closest to the transformer.

4. The impedance estimation device for a power distribution line according to claim 1, wherein the computation performed by the computation unit is performed by the impedance estimation device provided in an arbitrary consumer specified in advance among the plurality of consumers.

5. The impedance estimation device for a power distribution line according to claim 1, wherein the mutual communication over the single power distribution network is power line communication using the power distribution wires and the lead-in wires.

6. An impedance estimation method using an impedance estimation device for a power distribution line provided in each of a plurality of consumers individually connected to respective lead-in wires that branch off from a plurality of junctions on power distribution wires connected to a transformer, the impedance estimation devices forming a single power distribution network for mutual communication, the impedance estimation method for the power distribution line comprising:
measuring not only active power and reactive power of at least one of AC power supplied via the power distribution wire and the lead-in wire and consumed by the consumer and power generated by a generator connected to the consumer but also an effective value of at least one of current flowing into the consumer via the lead-in wire and current flowing into the consumer from the generator and an effective value of voltage, in synchronization with each other;
sharing the active power, the reactive power, the effective value of the current, and the effective value of the voltage measured in the measuring in each of the consumers among the plurality of consumers over mutual communication using the single power distribution network; and
setting up and solving a plurality of nonlinear simultaneous equations having the following corresponding to a plurality of different points of time as solutions: terminal impedance that is impedance of the power distribution wire from the junction on the lead-in wire to the consumer among the plurality of consumers that is adjacent to a terminal consumer in a position farthest from the transformer and is a second consumer counted from the terminal consumer, to the terminal consumer; lead-in wire impedance of the lead-in wire connected to each of the consumers; and inter-junction impedance between respective adjacent junctions, based on the active power, the reactive power, the effective value of the current, and the effective value of the voltage respectively measured by the measurement unit at the different points of time to derive estimated values of the terminal impedance, the lead-in wire impedance, and the inter-junction impedance.

* * * * *